(12) United States Patent
Corsi et al.

(10) Patent No.: US 6,262,632 B1
(45) Date of Patent: Jul. 17, 2001

(54) CONCEPT AND METHOD TO ENABLE FILTERLESS, EFFICIENT OPERATION OF CLASS-D AMPLIFIERS

(75) Inventors: Marco Corsi, Allen; Wayne Tien-Feng Chen, Plano; Roy Clifton Jones, III, Dallas, all of TX (US); Dan Mavencamp, Brandon; Kenneth Arcudia, Ridgeland, both of MS (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/441,620

(22) Filed: Nov. 16, 1999

(51) Int. Cl.[7] ................................................... H03F 3/217
(52) U.S. Cl. ....................................... 330/251; 330/207 A
(58) Field of Search ........................... 330/10, 146, 207 A, 330/251

(56) References Cited

U.S. PATENT DOCUMENTS

| | | | |
|---|---|---|---|
| 3,946,273 | * 3/1976 | Goddard | 315/297 |
| 4,162,455 | * 7/1979 | Birt | 330/10 |
| 4,356,432 | * 10/1982 | Vinarub | 315/287 |
| 4,949,048 | * 8/1990 | Tokumo et al. | 330/418 |
| 5,014,016 | * 5/1991 | Anderson | 330/10 |
| 5,307,407 | * 4/1994 | Wendt et al. | 379/418 |

* cited by examiner

*Primary Examiner*—Benny Lee
*Assistant Examiner*—Henry Choe
(74) *Attorney, Agent, or Firm*—Ronald O. Neerings; Wade James Brady, III; Frederick J. Telecky, Jr.

(57) ABSTRACT

A Class-D switching amplifier (30, 40) having a ternary mode of operation. Signal processing (21, 22) is provided to eliminate the potential of crosstalk within one channel by introducing a time delay into the system. A susceptible crosstalk point is moved away from a zero-crossing point to a higher power level, which is advantageous in low-end audio applications. A time delay is introduced to one ramp signal (RAMPB) in the first implementation (30), and an in-sync generator (42) is utilized in another implementation (40) using offset switching in the comparitors (40, 42) to create the time delay ($\Delta t$).

19 Claims, 4 Drawing Sheets

CONCEPT AND METHOD TO ENABLE FILTERLESS, EFFICIENT OPERATION OF CLASS-D AMPLIFIERS

CROSS REFERENCE TO RELATED APPLICATIONS

Cross reference is made to the commonly assigned copending patent application entitled "Modulation Scheme for Filterless Operation of Switching Amplifiers", the teaching of which are incorporated herein by reference.

FIELD OF THE INVENTION

The present invention is generally related to amplifier circuits, and more particularly to Class-D switching amplifiers.

BACKGROUND OF THE INVENTION

One method to achieve filterless Class-D switching amplifier operation, increased efficiency, and reduced cost is to deliver current to the load only when needed, and once delivered, maintain the current without decaying or wasting energy in removing the current. This can be accomplished by using a ternary modulation scheme implemented in an H-bridge configuration having four states of operation as shown in FIG. 1, FIG. 2, FIG. 3 and FIG. 4 as disclosed in commonly assigned copending patent application entitled "Modulation Scheme for Filterless Switching Amplifiers", filed herewith, the teachings of which are incorporated herein by reference. Voltage and current waveforms are shown in FIG. 5 and FIG. 6 for analog input into the amplifier.

In the presence of an input signal, the waveforms change as shown in FIG. 6 in view of FIG. 5. The edges of the OUTP waveform 12 move away from each other, and the edges of the OUTN waveform 14 move towards each other. The voltage difference of these two signals 12 and 14, which appears across a load shown as L1, generate narrow pulses as shown at 15 of waveform 16. These pulses 15 also have the desired affect of doubling the single-ended PWM frequency. Current does decay as the speaker as a load and MOSFETS are lossy, as shown as waveform 18. If the polarity of the input signal is reversed, the edges of OUTN (14) move away from each other and the edges of OUTP (12) move towards each other.

There is desired a signal processing scheme for the signals just described above.

SUMMARY OF THE INVENTION

The present invention achieves technical advantages as a signal processing circuit adapted for use within a Class-D amplifier that introduces a time-delay in control signals to move a susceptible crosstalk point away from a zero-crossing point to a higher power level.

One circuit and method provides circuitry that adds a time delay to one ramp waveform processed by a first comparator, while providing an non-delayed ramp waveform to a second comparator for processing. In this manner, switching of one-half the circuit will not couple disturbances into the output of the other half of the circuit, thereby making sure that signals generated do not trip circuitry prior to an expected zero crossing point.

The present invention achieves technical advantages in situations where zero-crossing of audio signals are smallest and are most likely to exist.

BRIEF DESCRIPTION OF THE DRAWINGS

Other aspects of the invention including specific embodiments are understood by reference to the following detail description taken in conjunction with the detail drawings in which.

DESCRIPTION OF THE PREFERRED EMBODIMENT

Figure 8:
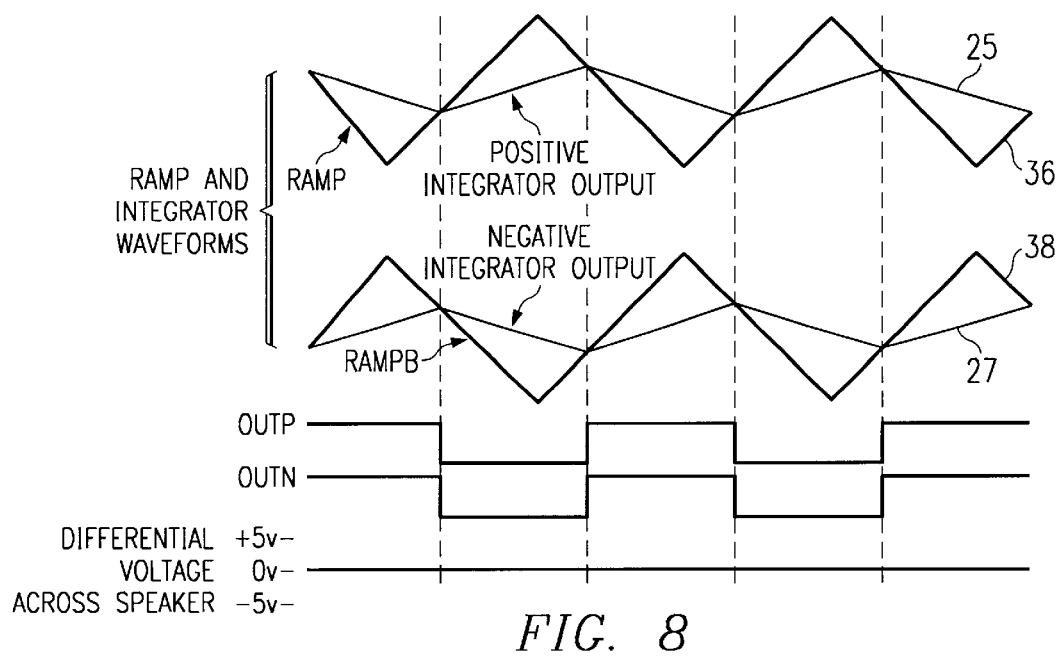
FIG. 8 is a timing diagram illustrating the ramp and integrator waveforms as a function of the signals OUTP and OUTN.
Figure 7:
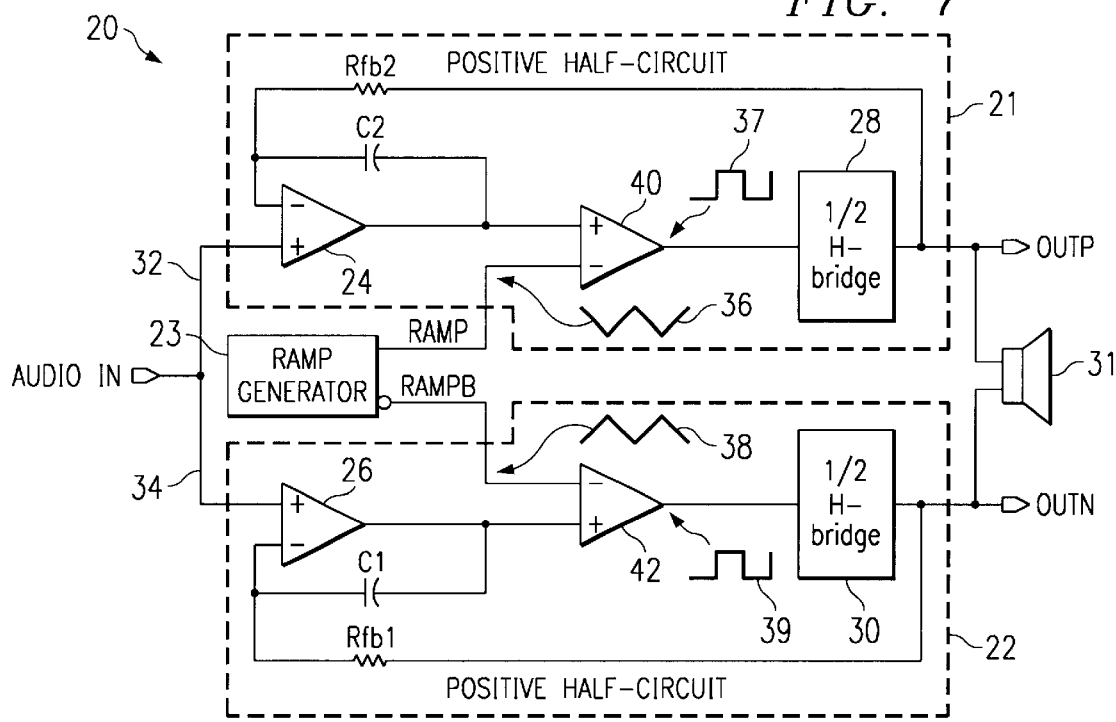
FIG. 7 is a schematic diagram of one implementation of the present invention providing ramp waveforms to comparators.

Referring now to FIG. 7, there is shown at 20 one preferred simplified circuit implementation of the present invention. FIG. 8 illustrates timing diagrams the voltage waveforms on the output of a ramp generator 23, integrator amplifiers 24 and 26, and H-bridge outputs 28 and 30 with zero input i.e. the audio-in signal to the input is zero. The circuit 20 in FIG. 7 is divided into a positive and a negative half-circuit 21 and 22, respectively. In a linearized system, these two half-circuits 21 and 22 operate in inverse phase to each other.

On the positive side of the circuit 21, the integrated analog signal 25 is compared by a comparator 40 with a signal ramp shown at 36 from the ramp generator 23 and the resulting pulse-width modulated (PWM) signal 37 is supplied to the half H-bridge 28.

Similarly, the negative side of the circuit 22 uses a similar integrated analog signal 26, but uses an inverse ramp signal RAMPB shown at 38 for comparison by comparator 42. However, note that the comparator outputs 37 and 39 switch for both the positive and negative sides occur at the same moment in time when no signal is input at input terminals 32 and 34, and the resulting squarewave carrier, which is much higher in frequency compared with the audio band, is actually in-phase.

Figure 1:
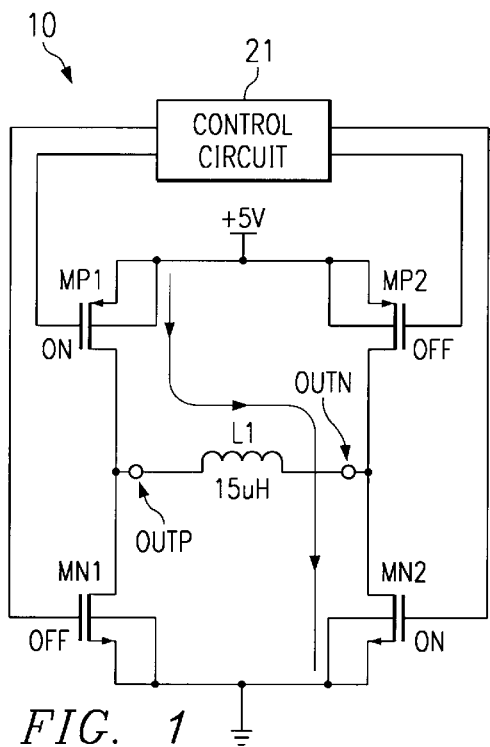
FIG. 1 is a first state of operation of a Class-D amplifier having a terinary control operation.
Figure 2:
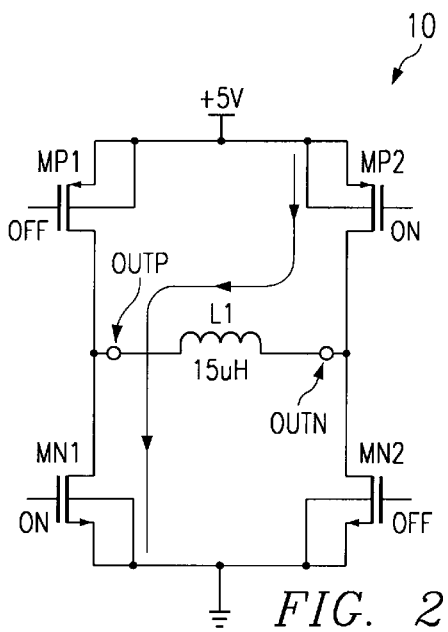
FIG. 2 is an illustration of a second state of operation.
Figure 3:
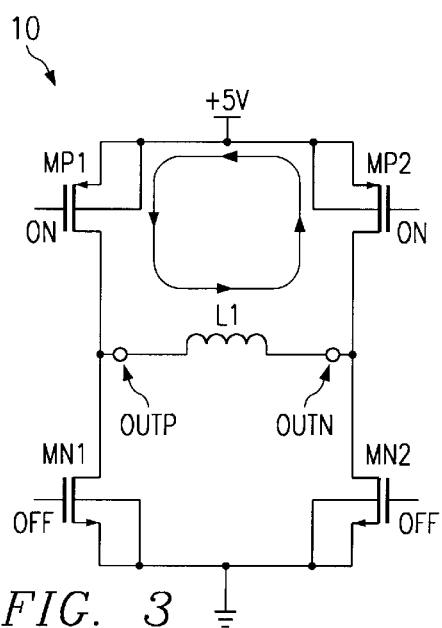
FIG. 3 is an illustration of a third state of operation.
Figure 4:
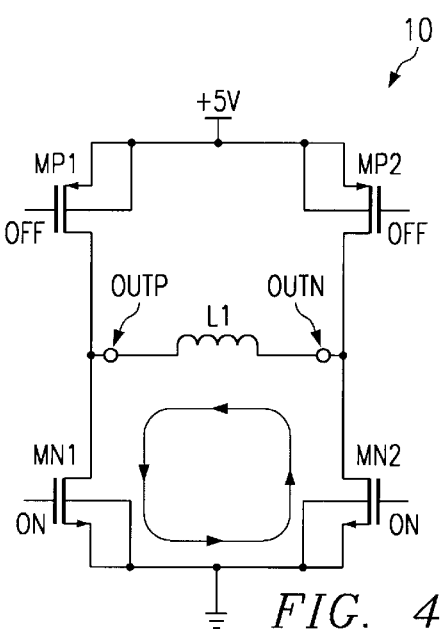
FIG. 4 is an illustration of a fourth sate of operation.
Figure 5:
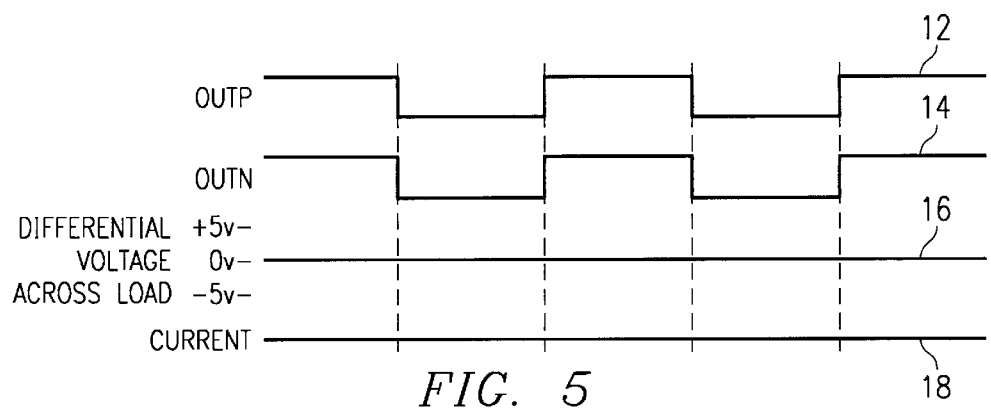
FIG. 5 is a timing diagram illustrating waveform signals generated during the third and fourth states of operation shown in FIG. 3 and 4 with no differential voltage being provided across the load, and thus no current being generated through the load.
Figure 6:
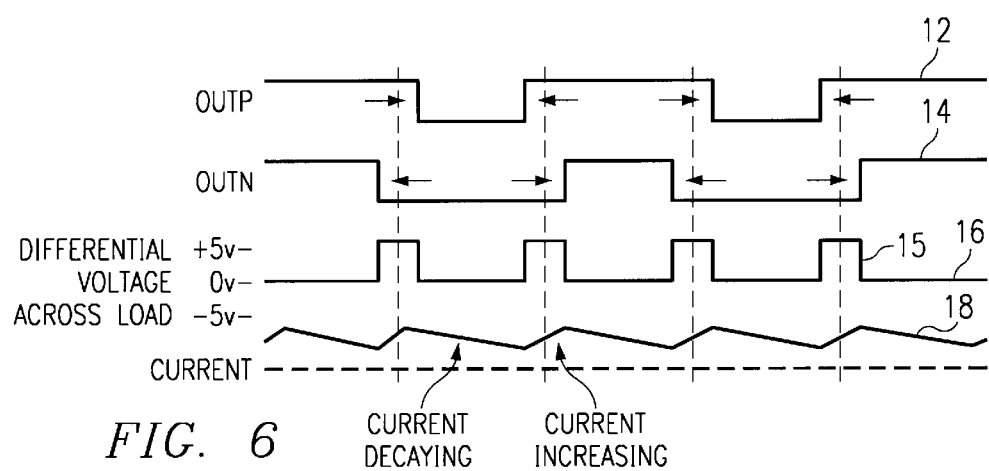
FIG. 6 is a timing diagram illustrating the first and fourth states of operation shown in FIG. 1 and FIG. 4, with the switches being pulsed width modulated to create a differential voltage seen as voltage pulses across the load and a corresponding current generated through the inductive load.

For operating with a small audio input signal, the waveform is as in FIG. 6 (expanded for clarity). For a fully integrated solution, switching noise on an integrated circuit (IC) is a concern, and it is quite likely that the switching noise from one of the half-circuits 21 and 22 will have an influence on the other half, which is much like crosstalk. In this example, the falling edge transition of OUTN occurs earlier than OUTP. The concern is that the switching of the negative half-circuit will couple disturbances onto the output of the positive integrator, making OUTP trip prior to it's expected crossing point. This problem would manifest itself near zero-crossing where audio signals are smallest and most likely to exist.

The present invention achieves technical advantages in audio applications where signals typically appear around the zero-crossing point. To eliminate the potential of "crosstalk" within one channel, a time delay is introduced into the system. This has the main effect of moving the susceptible crosstalk point away from zero-crossing to a higher power level. For low-end audio applications, this should not be noticeable.

Figure 9:
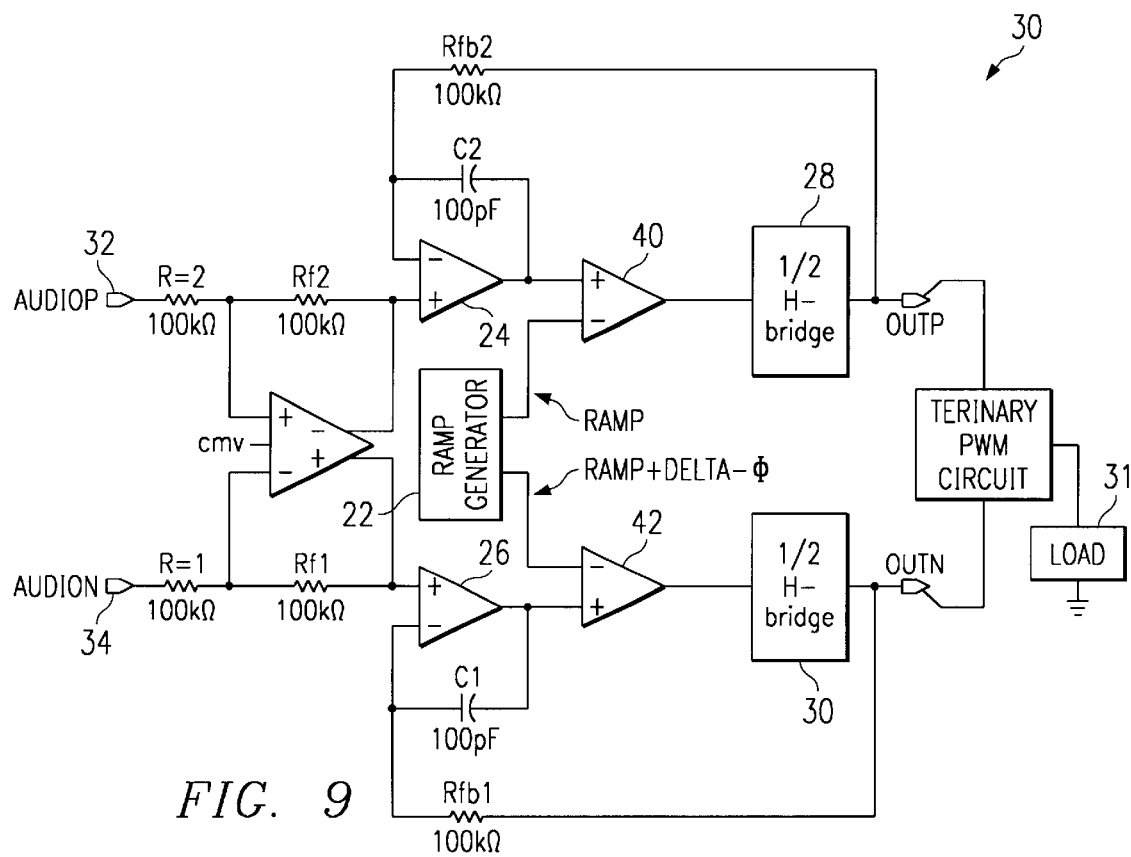
FIG. 9 is a schematic diagram of the present invention introducing a time delay into one of the ramp waveforms provided to one of the comparitors.

There are several conceived implementations of this circuitry. One method is to use the circuitry 30 in FIG. 9, adding a time delay to one of the ramp waveforms such as the one provided to comparator 42 using a PLL. FIG. 9 shows an approach that has been implemented in silicon where the analog signal is fully differentiated, and the in-phase ramp signals are phase-delayed.

Figure 10:
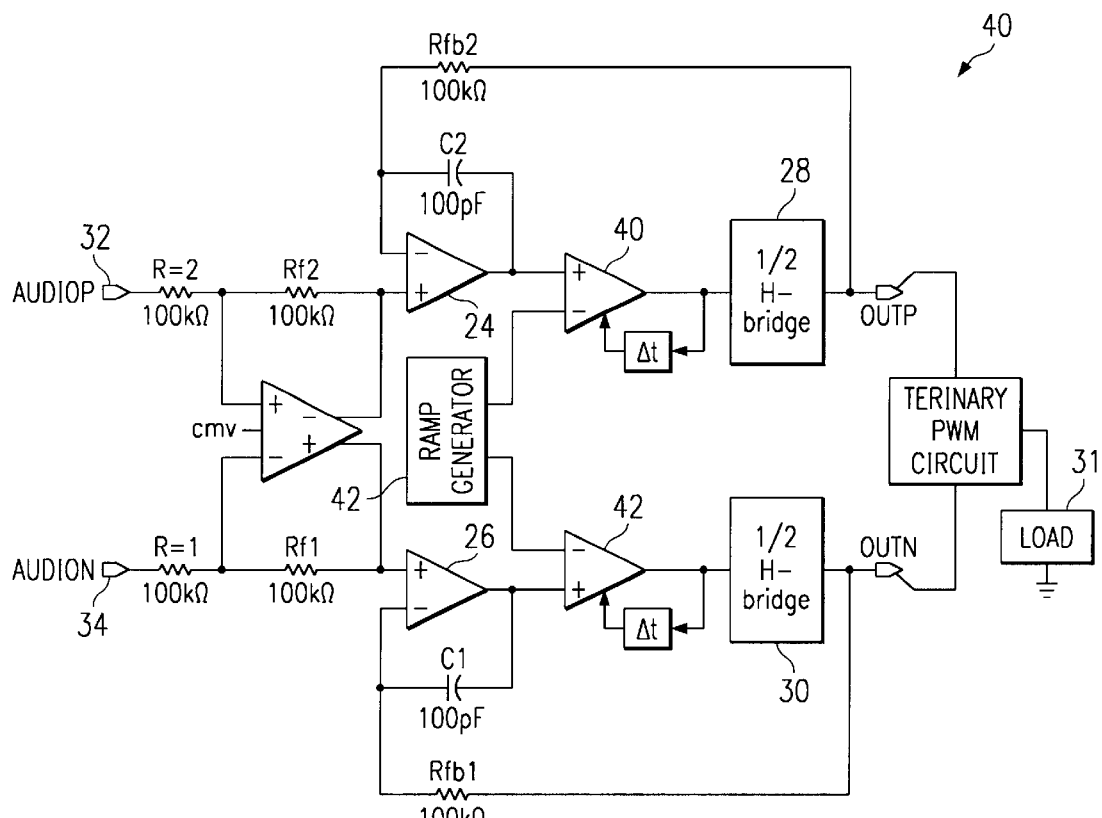
FIG. 10 is a schematic diagram of an alternative preferred embodiment of the present invention whereby in-sync ramp generators are used with the offset switching being provided in the comparitors to create the time delay.

FIG. 10 shows another approach as circuit 40 that has been implemented in silicon that uses in-sync ramp generators 42, but uses offset switching in the comparators 40 and 42 to create the time delay Δt as shown.

The present invention achieves technical advantages by allowing for filterless operation of Class-D amplifiers, which is a huge cost, board, and implementation savings. Costs of a filter for Class-D amplifiers at least matches silicon cost, thus making traditional Class-D solutions at least a 2× solution cost more than their linear counterparts. Eliminating the filters provides a Class-D amplifier that is cost competitive with linear amplifiers, and allows the resolution of low-level signals, which audio primarily comprises. The present invention is suited in Class-D audio power amplifiers, digital audio, stereo separation issues, and other applications where crosstalk between channels is an issue.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A Class-D amplifier for amplifying an input signal comprising:
    a first circuit having a generator generating a first waveform, the first circuit generating a first output signal as a function of the input signal and said first waveform;
    a second circuit having said generator generating a second waveform, the second circuit generating a second output signal as a function of the input signal and said second waveform, said second waveform corresponding to said first waveform, said second circuit time delaying the second waveform a predetermined time period relative to the first waveform; and
    a switching circuit generating an output signal as a function of said first output signal and said second output signal, said switching circuit comprising an H-bridge circuit responsively coupled to said first circuit and said second circuit and responsive to the first output signal and the second output signal.

2. The Class-D switching amplifier as specified in claim 1 wherein said H-bridge circuit has a first half and a second half, said first circuit generating a first ramp waveform as said first waveform and said second circuit generating a second ramp as said second waveform.

3. The Class-D switching amplifier as specified in claim 2 wherein each said first circuit and said second circuit have a respective comparator comparing the input signal to the respective ramp waveform.

4. A Class-D amplifier for amplifying an input signal comprising:
    a first circuit having a generator generating a first waveform, the first circuit generating a first output signal as a function of the input signal and said first waveform;
    a second circuit having said generator generating a second waveform, the second circuit generating a second output signal as a function of the input signal and said second waveform, said second waveform corresponding to said first waveform, said second circuit time delaying the second waveform a predetermined time period relative to the first waveform; and
    an H-bridge circuit for generating an output signal as a function of said first output signal and said second output signal, said H-bridge circuit responsively coupled to said first circuit and said second circuit and responsive to the first output signal and the second output signal, wherein each said first circuit and said second circuit have a respective comparator comparing the input signal to the respective ramp waveform and a respective integrator integrating the input signal and providing the integrated signal to the respective comparator.

5. The Class-D switching amplifier as specified in claim 1 further comprising an inductive load coupled to said H-bridge circuit.

6. The Class-D switching amplifier as specified in claim 1 wherein said second generator time delays the second waveform the predetermined time period.

7. The Class-D switching amplifier as specified in claim 3 wherein one said comparator delays the respective processed input signal the predetermined time period.

8. The Class-D switching amplifier as specified in claim 1 wherein the switching circuit has a ternary state of operation controlled by said first circuit output signal and said second circuit output signal.

9. The Class-D switching amplifier as specified in claim 8 wherein said switching circuit has a first, second, third and fourth switch each pulse-width modulated by one of the first and second output signals.

10. The Class-D switching amplifier as specified in claim 9 wherein said switching circuit has a first and second output terminal wherein no voltage potential is generated across said first and second output terminals when no input signal is provided to the amplifier.

11. The Class-D switching amplifier as specified in claim 10 wherein a voltage potential is generated across said first and second output terminals corresponding to a magnitude of the input signal.

12. The Class-D switching amplifier as specified in claim 11 wherein the voltage potential is provided a time period corresponding to the magnitude of the input signal.

13. The Class-D switching amplifier as specified in claim 9 wherein said first switch and said second switch are connected in series between a first voltage potential and a second voltage potential, and said third switch and said fourth switch are connected in series between the first voltage potential and the second voltage potential.

14. The Class-D switching amplifier as specified in claim 13 wherein said amplifier has a first output terminal defined between said first switch and said second switch, and a second output terminal defined between said third switch and said fourth switch.

15. The Class-D switching amplifier as specified in claim 14 further comprising an inductive load coupled between said first output terminal and said second output terminal.

16. The Class-D switching amplifier as specified in claim 13 wherein said second voltage potential is ground.

17. The Class-D switching amplifier as specified in claim 16 wherein said first voltage potential is positive with respect to ground.

18. The Class-D switching amplifier as specified in claim 9 wherein all said switches are MOS-type switches.

19. The Class-D switching amplifier as specified in claim 12 wherein the time period determines a first frequency being greater than a second frequency determined by said first output signal and said second output signal.

* * * * *

UNITED STATES PATENT AND TRADEMARK OFFICE
CERTIFICATE OF CORRECTION

PATENT NO. : 6,262,632 B1
DATED : July 17, 2001
INVENTOR(S) : Françoise Andolfatto et al.

It is certified that error appears in the above-identified patent and that said Letters Patent is hereby corrected as shown below:

<u>Title page,</u>
Item [75], Inventors, "Franaoise," should read -- Françoise --; and
"Lyons," should read -- Lyon --

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,262,632 B1
DATED : July 17, 2001
INVENTOR(S) : Marco Corsi et al.

It is certified that error appears in the above-identified patent and that said Letters Patent is hereby corrected as shown below:

This certificate supersedes Certificate of Correction issued August 10, 2004, the number was erroneously mentioned and should be vacated since no Certificate of Correction was granted.

Signed and Sealed this

Nineteenth Day of October, 2004

JON W. DUDAS
*Director of the United States Patent and Trademark Office*